(12) United States Patent
Pamulaparthy et al.

(10) Patent No.: US 8,587,290 B2
(45) Date of Patent: Nov. 19, 2013

(54) METHOD, SYSTEM AND DEVICE OF PHASE IDENTIFICATION USING A SMART METER

(75) Inventors: Balakrishna Pamulaparthy, Andhra Pradesh (IN); George Paul Gerdan, Beaconsfield Upper (AU)

(73) Assignee: General Electric Company, Schenectady, NY (US)

( * ) Notice: Subject to any disclaimer, the term of this patent is extended or adjusted under 35 U.S.C. 154(b) by 381 days.

(21) Appl. No.: 13/074,399

(22) Filed: Mar. 29, 2011

(65) Prior Publication Data

US 2012/0249121 A1 Oct. 4, 2012

(51) Int. Cl.
G01R 25/00 (2006.01)

(52) U.S. Cl.
USPC ............................................. 324/86; 324/142

(58) Field of Classification Search
USPC .............................................. 324/67, 86, 142
See application file for complete search history.

(56) References Cited

U.S. PATENT DOCUMENTS

| | | | |
|---|---|---|---|
| 4,116,073 A | 9/1978 | Mohler | |
| 4,852,174 A | 7/1989 | Bouchard | |
| 5,467,011 A | 11/1995 | Hunt | |
| 5,510,700 A | 4/1996 | Pomatto | |
| 5,548,207 A | 8/1996 | Smith | |
| 5,617,329 A | 4/1997 | Allison et al. | |
| 6,023,152 A | 2/2000 | Briest et al. | |
| 6,094,622 A | 7/2000 | Hubbard et al. | |
| 7,031,859 B2 | 4/2006 | Piesinger | |
| 7,054,770 B2 | 5/2006 | Swarztrauber et al. | |
| 7,304,467 B2 | 12/2007 | Grno | |
| 7,372,246 B2 | 5/2008 | Marsden et al. | |
| 7,860,672 B2 | 12/2010 | Richeson et al. | |
| 8,050,879 B2 | 11/2011 | Koste et al. | |
| 2003/0158677 A1 | 8/2003 | Swarztrauber et al. | |
| 2004/0000898 A1 | 1/2004 | Pool et al. | |
| 2004/0263147 A1 | 12/2004 | Piesinger | |
| 2007/0296396 A1 | 12/2007 | Nakahira | |
| 2008/0116877 A1 | 5/2008 | Giubbini et al. | |
| 2009/0213828 A1 | 8/2009 | Brundage et al. | |
| 2009/0233621 A1 | 9/2009 | Rhoads et al. | |

(Continued)

FOREIGN PATENT DOCUMENTS

| | | |
|---|---|---|
| DE | 29715826 U1 | 2/1998 |
| EP | 2204658 A1 | 7/2010 |

(Continued)

OTHER PUBLICATIONS

Search Report issued in connection with EP Application No. 12161900,1, Aug. 27, 2012.

(Continued)

Primary Examiner — Vincent Q Nguyen

(74) Attorney, Agent, or Firm — Fletcher Yoder, P.C.

(57) ABSTRACT

Methods, devices and systems of phase identification for a meter. One aspect includes a method of phase identification for a smart meter. One embodiment of the method includes connecting a device to at least a first phase of a poly-phase electrical system; metering at least the first phase of the poly-phase electrical system that the device is connected to for electrical consumption information using a meter; storing a first phase identifier for the first phase of the poly-phase electrical system that the device is connected to in a memory associated with the meter; and transmitting at least the first phase identifier over a network operably connected with the meter.

23 Claims, 8 Drawing Sheets

(56) References Cited

U.S. PATENT DOCUMENTS

| | | | |
|---|---|---|---|
| 2010/0007219 A1* | 1/2010 | de Buda et al. | 307/149 |
| 2010/0060259 A1 | 3/2010 | Vaswani et al. | |
| 2010/0134089 A1 | 6/2010 | Uram et al. | |
| 2010/0164473 A1 | 7/2010 | Caird | |
| 2010/0262393 A1 | 10/2010 | Sharma et al. | |
| 2010/0262395 A1 | 10/2010 | Sharma et al. | |
| 2011/0161022 A1 | 6/2011 | Caird | |
| 2011/0285382 A1 | 11/2011 | Kolwalkar et al. | |

FOREIGN PATENT DOCUMENTS

| | | |
|---|---|---|
| GB | 2267971 | 12/1993 |
| JP | 6115371 | 7/1986 |
| JP | 2000055961 | 2/2000 |
| JP | 2001133497 | 5/2001 |
| WO | 9500991 A1 | 1/1995 |
| WO | 2005116668 A1 | 12/2005 |
| WO | 2006018031 A1 | 2/2006 |
| WO | 2008014945 A2 | 2/2008 |
| WO | 2008052826 A1 | 5/2008 |
| WO | 2009017328 A2 | 2/2009 |
| WO | 2009057164 A1 | 5/2009 |
| WO | 2010/089396 A2 | 8/2010 |

OTHER PUBLICATIONS

Examination Report for New Zealand application No. 599079, dated Apr. 3, 2012, pp. 1-2.

Extended European Search Report for European application No. 12161900.1, dated Aug. 27, 2012, pp. 1-8.

Office Action issued in connection with New Zealand Patent Application No. 559079, Apr. 3, 2012.

* cited by examiner

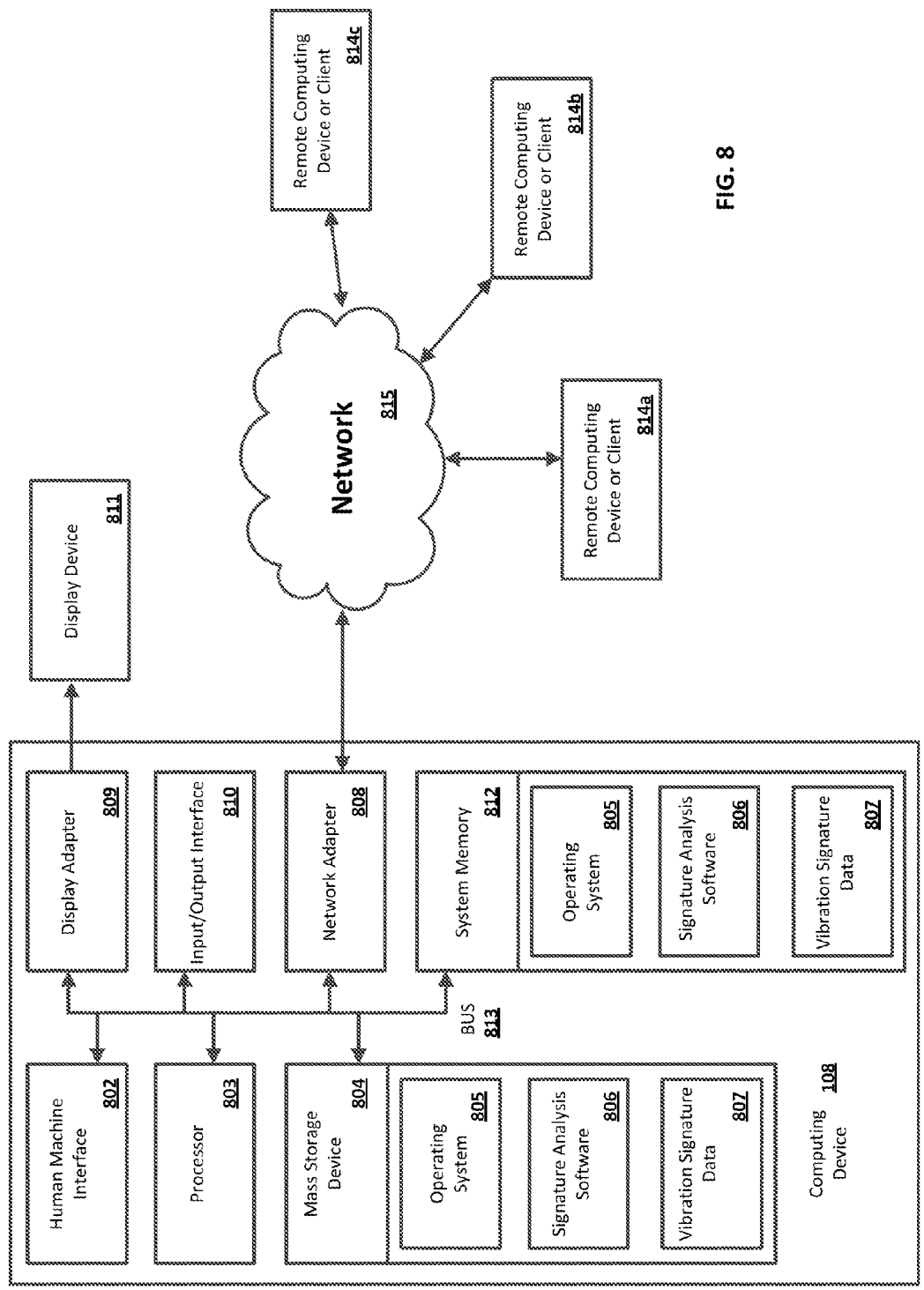

METHOD, SYSTEM AND DEVICE OF PHASE IDENTIFICATION USING A SMART METER

BACKGROUND OF THE INVENTION

In many instances, utility providers desire to electronically communicate with the utility service meters for numerous purposes including scheduling disconnection or connection of utility services to the metered loads, automatic meter reading (AMR), load shedding and load control, automatic distribution and smart-grid applications, outage reporting, providing additional services such as Internet, video, and audio, etc. In many of these instances, to perform these functions the meters must be configured to communicate with one or more computing devices through a communications network, which can be wired, wireless or a combination of wired and wireless, as known to one of ordinary skill in the art.

In many instances, such meters are also equipped with an electromechanical switch that can be actuated remotely to perform functions such as disconnection or connection of utility services to the metered loads, load shedding and load control, and the like. However, in many instances the utility also desires to know which phase or phases of a poly-phase electrical system the load is connected, or which phase or phases a load control relay is connected. One challenge faced by the utilities is that the records are incomplete or inaccurate that indicate to a smart meter installer which phase an individual customer is connected. Therefore, in order to accurately identify the current phase of a particular feeder branch, utility company personnel must physically trace a cable run back through various distribution facilities until they reach a point in the distribution network at which the phase is definitively known. This can be a very time-consuming and labor-intensive process, which can often lead to incorrect information. During storms or emergencies this can also lead to safety issues as well. When a utility performs various operations such as load profiling, analyzing power quality, loading of each phase, distribution system planning, and the like, it is important to know on which phase or phases the smart meters are connected so that analysis can be done with respect to each phase.

Therefore, systems and methods are desired that provide phase identification of a smart meter that overcome challenges present in the art, some of which are described above.

BRIEF DESCRIPTION OF THE INVENTION

Described herein are embodiments of methods, devices and systems for phase identification of a smart meter.

One aspect comprises a method of phase identification for a smart meter. One embodiment of the method comprises connecting a device to at least a first phase of a poly-phase electrical system; metering at least the first phase of the poly-phase electrical system that the device is connected to for electrical consumption information using a smart meter; storing a first phase identifier for the first phase of the poly-phase electrical system that the device is connected to in a memory associated with the smart meter; and transmitting at least the first phase identifier over a network operably connected with the smart meter.

Another aspect comprises a smart meter. One embodiment of the smart meter is comprised of one or more switches, metering components, a memory, at least one network interface, and a processor. The one or more switches can be used to connect a device to at least a first phase of a poly-phase electrical system. The metering components can be used to meter at least the first phase of the poly-phase electrical system that the device is connected to for electrical consumption information. The processor is operably connected with the one or more switches, the metering components, the memory and the at least one network interface. The processor is configured to: store a first phase identifier for the first phase of the poly-phase electrical system that the device is connected to in the memory; and retrieve the first phase identifier for the first phase of the poly-phase electrical system that the device is connected to from the memory and transmit at least the first phase identifier over a network operably connected with the smart meter using the network interface.

In yet another aspect, a system is described. One embodiment of the system is comprised of a computing device, a network operably connected to the computing device, and a smart meter operably connected with the network. In one aspect, the smart meter is comprised of one or more switches, metering components, a memory, at least one network interface, and a processor. The one or more switches can be used to connect a device to at least a first phase of a poly-phase electrical system. The metering components can be used to meter at least the first phase of the poly-phase electrical system that the device is connected to for electrical consumption information. The processor is operably connected with the one or more switches, the metering components, the memory and the at least one network interface. The processor is configured to: store a first phase identifier for the first phase of the poly-phase electrical system that the device is connected to in the memory; and retrieve the first phase identifier for the first phase of the poly-phase electrical system that the device is connected to from the memory and transmit at least the first phase identifier over a network operably connected with the smart meter using the network interface.

Additional advantages will be set forth in part in the description which follows or may be learned by practice. The advantages will be realized and attained by means of the elements and combinations particularly pointed out in the appended claims. It is to be understood that both the foregoing general description and the following detailed description are exemplary and explanatory only and are not restrictive, as claimed.

BRIEF DESCRIPTION OF THE DRAWINGS

The accompanying drawings, which are incorporated in and constitute a part of this specification, illustrate embodiments and together with the description, serve to explain the principles of the methods and systems:

FIG. 8 is a block diagram illustrating an exemplary operating environment for performing the disclosed methods.

DETAILED DESCRIPTION OF THE INVENTION

Before the present methods and systems are disclosed and described, it is to be understood that the methods and systems are not limited to specific synthetic methods, specific components, or to particular compositions. It is also to be understood that the terminology used herein is for the purpose of describing particular embodiments only and is not intended to be limiting.

As used in the specification and the appended claims, the singular forms "a," "an" and "the" include plural referents unless the context clearly dictates otherwise. Ranges may be expressed herein as from "about" one particular value, and/or to "about" another particular value. When such a range is expressed, another embodiment includes from the one particular value and/or to the other particular value. Similarly, when values are expressed as approximations, by use of the antecedent "about," it will be understood that the particular value forms another embodiment. It will be further understood that the endpoints of each of the ranges are significant both in relation to the other endpoint, and independently of the other endpoint.

"Optional" or "optionally" means that the subsequently described event or circumstance may or may not occur, and that the description includes instances where said event or circumstance occurs and instances where it does not.

Throughout the description and claims of this specification, the word "comprise" and variations of the word, such as "comprising" and "comprises," means "including but not limited to," and is not intended to exclude, for example, other additives, components, integers or steps. "Exemplary" means "an example of" and is not intended to convey an indication of a preferred or ideal embodiment. "Such as" is not used in a restrictive sense, but for explanatory purposes.

Disclosed are components that can be used to perform the disclosed methods and systems. These and other components are disclosed herein, and it is understood that when combinations, subsets, interactions, groups, etc. of these components are disclosed that while specific reference of each various individual and collective combinations and permutation of these may not be explicitly disclosed, each is specifically contemplated and described herein, for all methods and systems. This applies to all aspects of this application including, but not limited to, steps in disclosed methods. Thus, if there are a variety of additional steps that can be performed it is understood that each of these additional steps can be performed with any specific embodiment or combination of embodiments of the disclosed methods.

The present methods and systems may be understood more readily by reference to the following detailed description of preferred embodiments and the Examples included therein and to the Figures and their previous and following description.

Figure 1A:
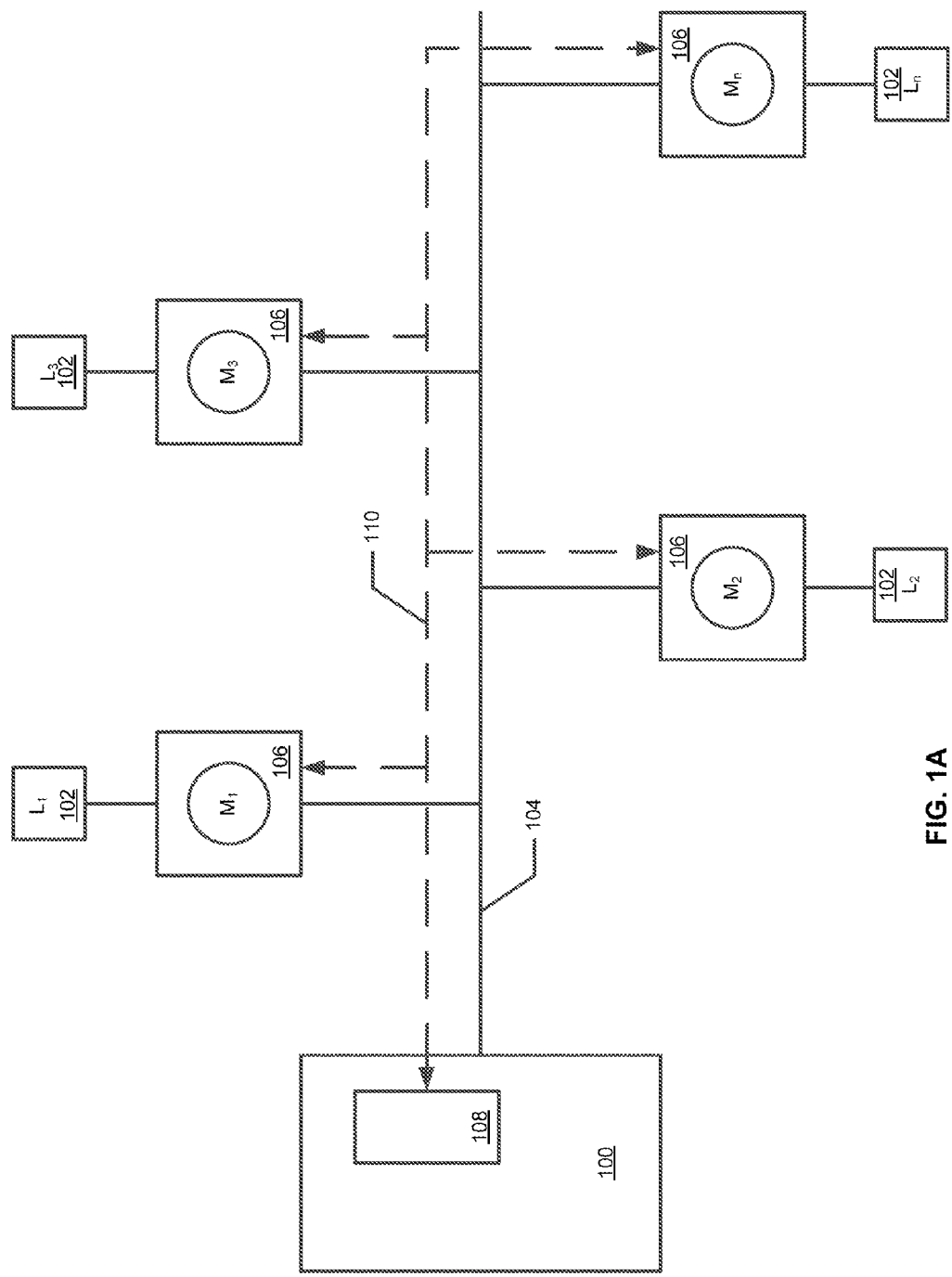
FIG. 1A is a single-line block diagram of a section of an exemplary utility distribution system.

Referring to FIG. 1A, an illustration of one type of system that would benefit from embodiments of the present invention is provided. FIG. 1A is a single-line block diagram of a section of an exemplary utility distribution system such as, for example, an electric distribution system. As shown in FIG. 1A, a utility service is delivered by a utility provider 100 to various loads $L_1$-$L_n$ 102 through a distribution system 104. In one aspect, the utility service provided can be electric power. Though shown in FIG. 1A as a single-line diagram, it is to be appreciated that the distribution system 104 can be comprised of single-phase and/or poly-phase components and be of varying voltage levels. Consumption and demand by the loads 102 can be measured at the load locations by meters $M_1$-$M_n$ 106. If an electric meter, the meters 106 can be single-phase or poly-phase electric meters, as known to one of ordinary skill in the art, depending upon the load 102. For example, the load can be single-phase and therefore the meter 106 can be single phase. Single-phase loads can be connected to different phases (e.g., phase A, phase B or phase C) of the distribution system 104. Similarly, for example, the load 102 can be a poly-phase load such as a three-phase load and the meter 106 can be a three-phase meter that meters the three phases serving the load 102.

In one aspect, the electric meter 106 is a smart meter as described herein and as known to one of ordinary skill in the art. Hereinafter, the specification will refer to the meter 106 as a "meter," "electric meter," and/or "smart meter," where the terms can be used interchangeably. One non-limiting example of a smart meter is the GE 1210+c meter as available from General Electric Company ("GE") (Schenectady, N.Y.). Another non-limiting example of a smart meter is the GE SM3000 meter as also available from GE. While consumption or demand information is used by the utility provider 100 primarily for billing the consumer, it also can be used for other purposes including planning and profiling the utility distribution system. In some instances, utility providers 100 desire to electronically communicate with the meters 106 for numerous purposes including scheduling disconnection or connection of utility services to the loads 102, automatic meter reading (AMR), load shedding and load control, automatic distribution and smart-grid applications, outage reporting, providing additional services such as Internet, video, and audio, etc. In many of these instances, the meters 106 must be configured to communicate with one or more computing devices 108 through a communications network 110, which can be wired, wireless or a combination of wired and wireless, as known to one of ordinary skill in the art. In one aspect, the network 110 is an advanced metering infrastructure (AMI) network. AMI refers to systems that measure, collect and analyze energy usage, and interact with advanced devices such as electricity meters, gas meters, water meters, and the like through various communication media either on request (on-demand) or on pre-defined schedules. This infrastructure includes hardware, software, communications, consumer energy displays and controllers, customer associated systems, meter data management (MDM) software, supplier and network distribution business systems, and the like. The network 110 between the measurement devices (e.g., meters 106) and business systems allows collection and distribution of information to customers, suppliers, utility companies and service providers. This enables these businesses to either participate in, or provide, demand response solutions, products and services. By providing information to customers, the system assists a change in energy usage from their normal consumption patterns, either in response to changes in price or as incentives designed to encourage lower energy usage use at times of peak-demand periods or higher wholesale prices or during periods of low operational systems reliability. In one aspect, the network 110 comprises at least a portion of a smart grid network. In one aspect, the network 110 utilizes one or more of one or more of a WPAN (e.g., ZigBee, Bluetooth), LAN/WLAN (e.g., 802.11n, microwave, laser, etc.), WMAN (e.g., WiMAX, etc.), WAN/WWAN (e.g., UMTS, GPRS, EDGE, CDMA, GSM, CDPD, Mobitex, HSDPA, HSUPA, 3G, etc.), RS232, USB, Firewire, Ethernet, wireless USB, cellular, OpenHAN, power line carrier (PLC), broadband over power lines (BPL), and the like. Such meters 106 can be equipped with one or more switches that can be used to remotely connect or disconnect the service or product delivered.

Figure 1B:
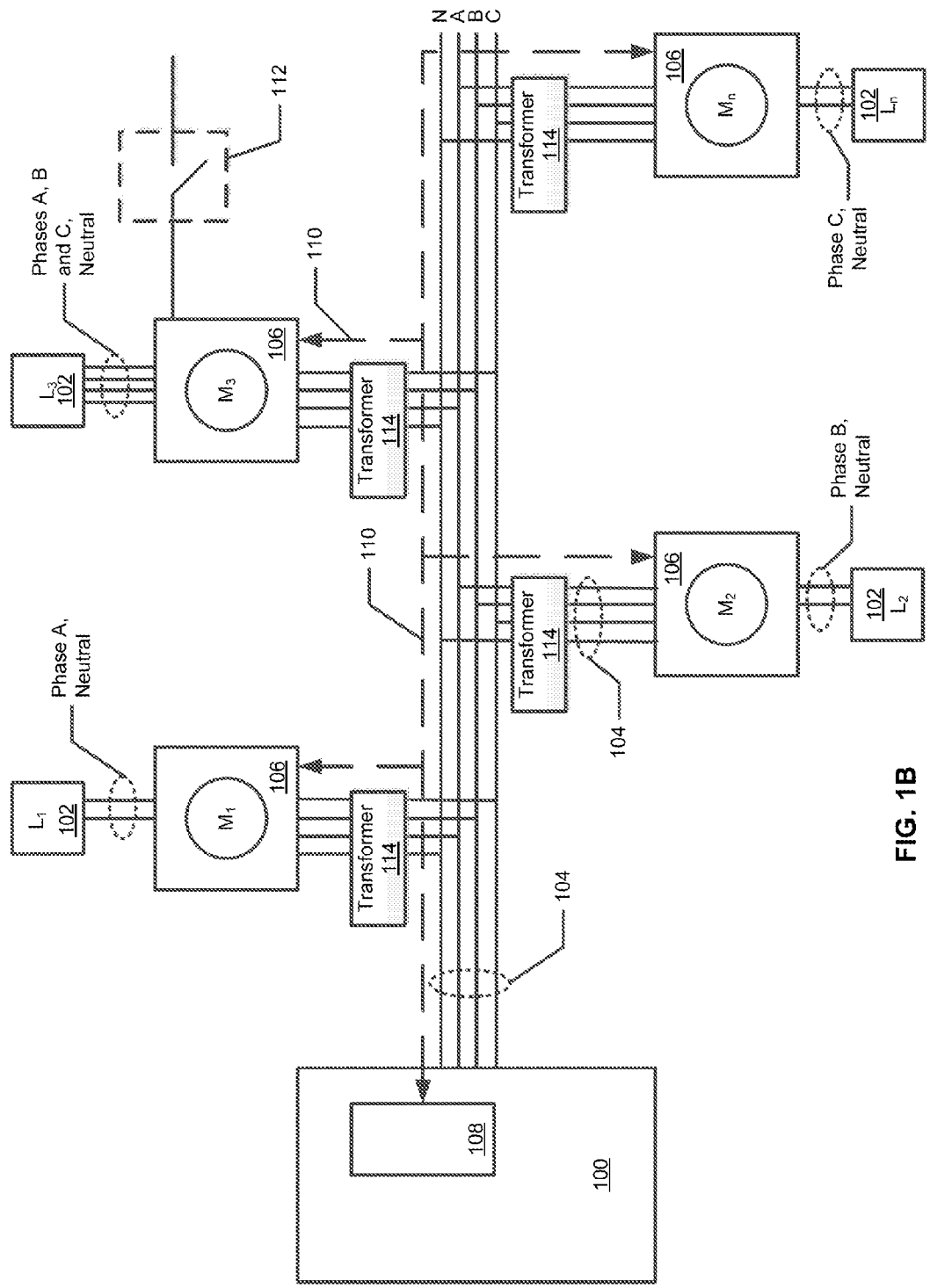
FIG. 1B is an exemplary illustration of a three-phase, four-wire (phases A, B, C and neutral, N) distribution system 104 according to one embodiment of the present invention.

For example, in some instances an electrical distribution system 104 may be a poly-phase system such as a three-phase, four-wire network, which supplies power-using feeders. Each of the feeder lines then branches into multiple circuits to power a plurality of local pole-mounted or pad-mounted transformers, which step the voltage down to final voltages of, for example, 120 or 240 volts per phase for delivery and metering at commercial and residential customer locations. Generally, residential customers can be connected to any one phase of the three-phase system using a single-phase meter and commercial customers can be connected to all the three phases using three-phase meter with a load control relay ("LCR") connected on any one of the phases. When a utility performs various operations such as load profiling, analyzing power quality, loading of each phase, etc., it is desired to know on which phase smart meter is connected so that the analysis can be performed with respect to each phase. Such a system as described above is illustrated in FIG. 1B. FIG. 1B is an exemplary illustration of a three-phase, four-wire (phases A, B, C and neutral, N) distribution system 104 according to one embodiment of the present invention. As shown in FIG. 4B, distribution system 104 is comprised of three phase conductors (phases A, B and C) and a neutral wire. In one aspect, each of three phases and the neutral are provided to each meter 106. In one aspect, the voltage provided at the meters 106 is stepped down by a transformer 114 to a level that can be used by the load 102 (e.g. 120/240, 277/480, and the like). The transformer 114 can be two or three single-phase transformers, or a single three-phase transformer. In one aspect, the load 102 can be single phase, and the meter 106 can be configured to switch between phases A, B and C to serve the load 102, or to disconnect the load 102 from electric service. In one aspect, this switching can be manually performed. In another aspect, this switching can be performed automatically and remotely. In another aspect, the load 102 can be three-phase and can be metered by a three-phase meter 106. In one aspect, the three-phase meter can comprise a load control relay (LCR) 112. In one aspect, the three-phase meter 106 can be configured to switch between phases A, B and C to serve the LCR 112, or to disconnect the LCR 112 from electric service. In one aspect, this switching can be manually performed. In another aspect, this switching can be performed automatically and remotely. For balancing the load on each phase of the distribution system 104 and performing other utility functions and analysis, it is desired to know the phase that a load 102 is connected or the phase that a LCR 112 is connected.

Methods, systems and devices to determine the phase to which meter is connected in case of a single-phase meter and the phase to which a LCR is connected in case of poly-phase meter are desired. Therefore, it is desired that the meters 106 of a system such as that shown in FIGS. 1A and 1B are configured to have capabilities beyond that of measurement of utility service consumption. Described herein are embodiments of methods, devices and systems for phase identification in a smart meter. In one aspect, a field for phase identification is maintained in a memory of a smart meter. The phase identifier can be read or written (depending on security) by a utility using advanced communication techniques such as AMI, Optical, RF, WiMax, LAN/WAN, GSM, etc., and meter software (e.g., GE Meter Mate™ software). In case of a single-phase meter, this field can represent the phase to which the main relay is connected and in the case of poly-phase meter (e.g., three-phase), this field can represent the phase to which an LCR is connected. In one aspect, the phase identification field can be configured to update automatically. For example, if a meter is configured such that it can switch the phase that serves the load (and that is being metered), then such a meter can be configured to automatically populate the phase identifier field with the phase to which the load is connected. Such a meter that can switch phases is described in U.S. patent application Ser. No. 12/987,301 by Pamulaparthy, filed Jan. 10, 2011, which is fully incorporated herein by reference and made a part hereof. In another aspect, the phase identification field can be provided over the network to the meter if an entire feeder has been switched using, for example, automated distribution switches as part of a smart-grid implementation. In another aspect, the phase identification field can be stored manually whenever phase configuration as stated above is changed for a particular meter. For example, in automatic population of the phase identifier field, upon receiving a command to switch phases (for example, from phase A to phase B), the phase to which meter is currently connected is read (phase A) and a relay will be switched to phase B and the phase identifier field will be updated from phase A to phase B. In case of manual, for example, if a utility person changes the connection of meter or LCR from one phase to other, the person can write the field (assuming the person has security access) using software (for example, GE Meter Mate™ software) and any of the communication media such as AMI, Optical, RF, WiMax, LAN/WAN, GSM, etc. Phase change events can be logged in an event log kept at either or both the meter and the computing device 108 for future reference.

Figure 2:
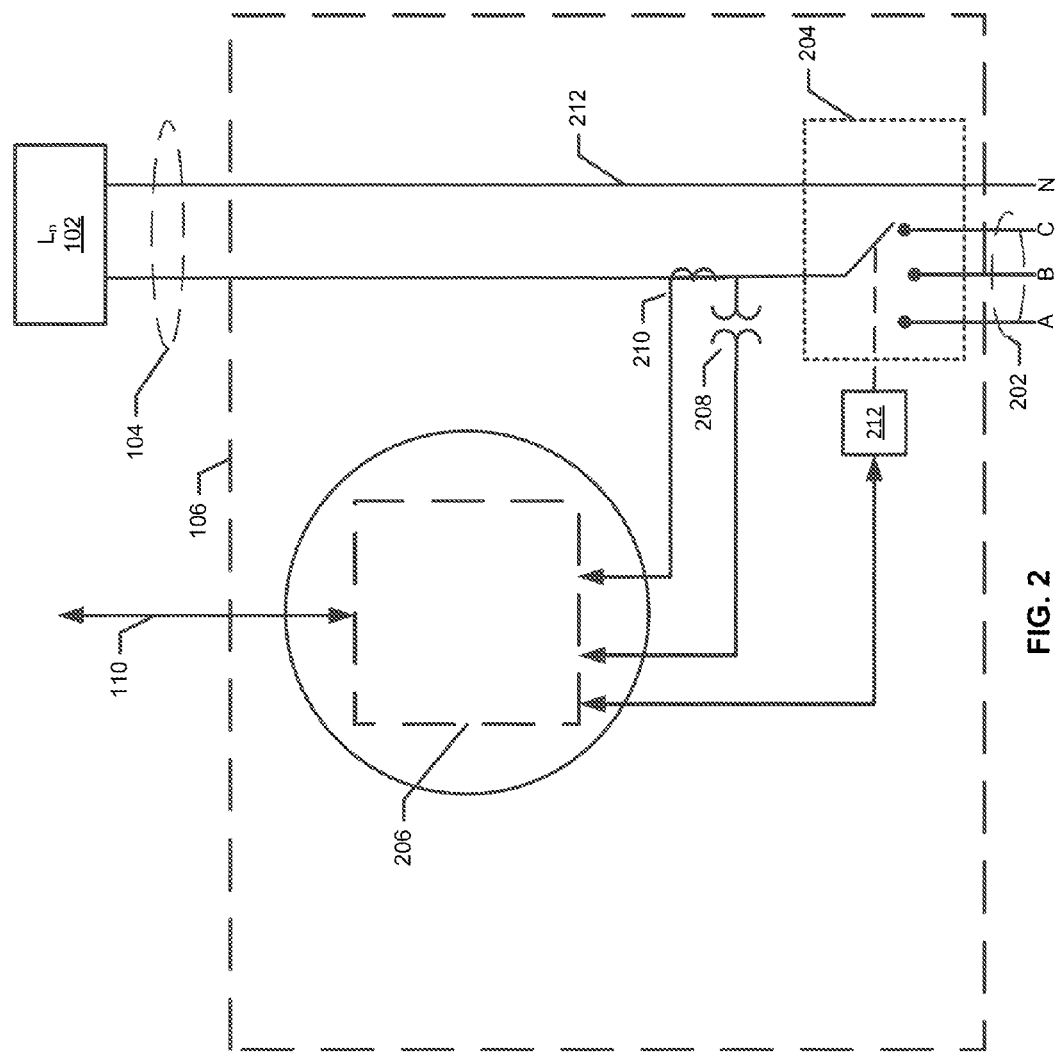
FIG. 2 illustrates an overview block diagram of a non-limiting embodiment of a meter that can be used to practice embodiments of the present invention.

FIG. 2 illustrates an overview block diagram of a non-limiting embodiment of a meter 106 that can be used to practice embodiments of the present invention. In this exemplary embodiment, the utility service is poly-phase electric power. Particularly, in FIG. 2 the electric service is three-phase, four-wire electric power generally comprised of three phase conductors 202 each carrying electric voltage and current that is generally displaced from one another by 120 degrees (e.g., phases A, B and C) and a separate neutral wire 214. It is to be appreciated, however, that the embodiments of the invention can be used with single- and poly-phase electrical systems such as two-phase, three-phase, four-phase, etc. Further comprising the embodiment of a meter 106 shown in FIG. 2 is a switch 204. The switch 204, though shown as a three pole, single-throw switch, can be a single switch or any combination of single or multi-pole switches that provide a means to selectively switch the power feed 104 that provides electrical service from among the plurality of phase conductors 202 (e.g., phases A, B or C), or to disconnect the load 102 from electrical service. In this manner, the load 102 can be provided with single-phase electrical service from among any of a plurality of phases. It is also to be appreciated that such a meter 106 can be configured to switch among two, three, four, five, etc. phases, and is not limited to just a three-phase configuration to provide single-phase service to the load 102. In one aspect, the switch 204 can be controlled by a control mechanism 212 that actuates the switch 204 (i.e., causes it to switch from one phase to another or to disconnect the load). The control mechanism 212 receives a control signal from the meter's electronics 206. Furthermore, in one aspect, the control mechanism 212 can provide a feedback signal to the meter's electronics 206 that indicates the position of the switch 204. In other words, the control mechanism 212 can inform the meter's electronics whether the load 102 is being provided single-phase electric service from phase A, phase B, phase C, etc., or whether the load 102 is disconnected from electric service.

Analog voltage and current inputs are also provided to meter electronics 206. In one aspect, the analog signals are derived from the electrical power feed 104 serving the load 102 and the one being metered by the meter 106. In another aspect, the analog signals are derived from a separate electrical source. In one aspect, the analog voltage signal can be provided by one or more potential transformers (PT) 208, if needed, though other means such as a voltage divider, capacitive coupling, or the like can be used. If the voltage level of the source is sufficiently low (e.g., 0.25 volts AC, or lower), then a PT 208 or other means of stepping down or transforming the voltage can be omitted. Similarly, in one aspect, the analog current signal can be provided by one or more current transformers (CT) 210. In one aspect, the one or more CTs 210 can have a turns ratio of 1:2500. In one aspect, one or more resistors (not shown) can be used to convert the current signal from the CT 210 into a voltage signal.

In one aspect, the meter electronics 206 can comprise a memory (not shown in FIG. 2). The memory can be used to store a phase identifier that indicates the phase of the poly-phase electrical system that the load 102 (and meter 106) are connected. For example, if the switch 204 is configured such that the electrical power feed 104 serving the load 102 and the one being metered by the meter 106 is phase A, then the phase identifier stored in the memory indicates phase A. Similarly, if the switch 204 switches from phase A to phase B, then the phase identifier stored in the memory is updated to indicate phase B. In one aspect, the phase identifier is stored automatically when the power feed 104 is switched from one phase to another (e.g., from phase A to phase B). For example, the control mechanism 212 can provide a signal that indicates the phase that the load 102 is connected to. In one non-limiting example, a signal can be sent to the meter 106 over a network 110. In one aspect, the network 110 is an advanced metering infrastructure (AMI) network. The signal can be a command to switch phases to which the load is connected from a first phase (e.g., phase A) to a second phase (e.g., phase B), or to disconnect the load 102. The command is received by a processor (not shown in FIG. 2) in the meter's electronics 206, which causes the control mechanism 212 to switch the connection from phase A to phase B. The phase identifier in the memory is then updated to reflect that the load 102 and meter 106 are now connected to phase B. In another aspect, the phase identifier can be stored in the meter 106 manually by a user that has authorization to write to the memory using, for example, infrared, near-field communications such as Blue-Tooth, Wi-Fi, RF, RFID, and the like, or by connecting a device such as a computer to the meter 106 using a bus connection. In another aspect, the phase identifier can be communicated to the memory in the meter's electronics 206 via a network 110 that is operably connected with the meter's electronics 206. In one aspect, the network 110 is an advanced metering infrastructure (AMI) network. For example, if an entire circuit is switched, either automatically or manually, by a utility such that phase A becomes phase B or some other similar switching, then a signal can be sent to the meter's electronics 206 over the network to update the phase identifier such that indicates the meter 206 and the load 102 are connected to phase B. Once the phase identifier is stored in the memory, it can be transmitted over the network 110 to, for example, the computing device 108 or it can be read from the memory by a user with proper authorization and equipment.

In one aspect, the electronics 206 comprise at least a memory, and one or more processors and provide an interface for receiving a signal from the network 110 and causing the switch 204 to actuate via the control mechanism 212. The memory of the meter electronics 206 can be used to store a phase identifier as described above. The meter electronics 206 can comprise a transmitter that can be used to transmit at least the phase identifier over the network 110 to a separate computing device 108. In one aspect, the meter's electronics 206 can comprise one or more metering micro-controllers including a Teridian 6533 controller or a Teridian 6521 controller as are available from Maxim Integrated Products, Inc. (Sunnyvale, Calif.), among others. In one aspect, the one or more processors can perform metering functions such as determining the number of kilowatt-hours (KWH) of electricity consumed by the load 102.

In one aspect, the one or more processors of the meter electronics 206 can be configured to store a first phase identifier for the first phase of the poly-phase electrical system that the load 102 is connected to in the memory. Then, when requested, the processor can retrieve the first phase identifier for the first phase of the poly-phase electrical system that the device is connected to from the memory and transmit at least the first phase identifier to the computing device 108 over the network 110 operably connected with the smart meter 106 using the network interface. In one aspect, the network 110 is an advanced metering infrastructure (AMI) network. In one aspect, the switch 204 can be used to switch the load 102 such that the load is connected to at least a second phase of the poly-phase electrical system such that the metering components meter at least the second phase of the poly-phase electrical system that the load 102 is connected to for electrical consumption information using the smart meter 102. The one or more processors are further configured to store a second phase identifier for the second phase of the poly-phase electrical system that the load 102 is connected to in the memory associated with the smart meter 106. The one or more processors are also configured to retrieve the second phase identifier for the second phase of the poly-phase electrical system that the load 102 is connected to from the memory and transmit at least the second phase identifier to the computing device 108 over the network 110 operably connected with the smart meter 106 using the network interface. In one aspect, the switch 204 is an automatic switch controlled by the processor and switching the load 102 such that the load 102 is connected to at least the second phase of the poly-phase electrical system comprises automatically switching the load 102 from the first phase to the second phase of the poly-phase electrical system using the switch 204. In one aspect, the one or more processors are operably connected with the switch 204 such that storing the second phase identifier for the second phase of the poly-phase electrical system that the load 102 is connected to in the memory associated with the smart meter 106 comprises automatically storing the second phase identifier in the memory when the device is switched from the first phase to the second phase of the poly-phase electrical system.

Figure 3:
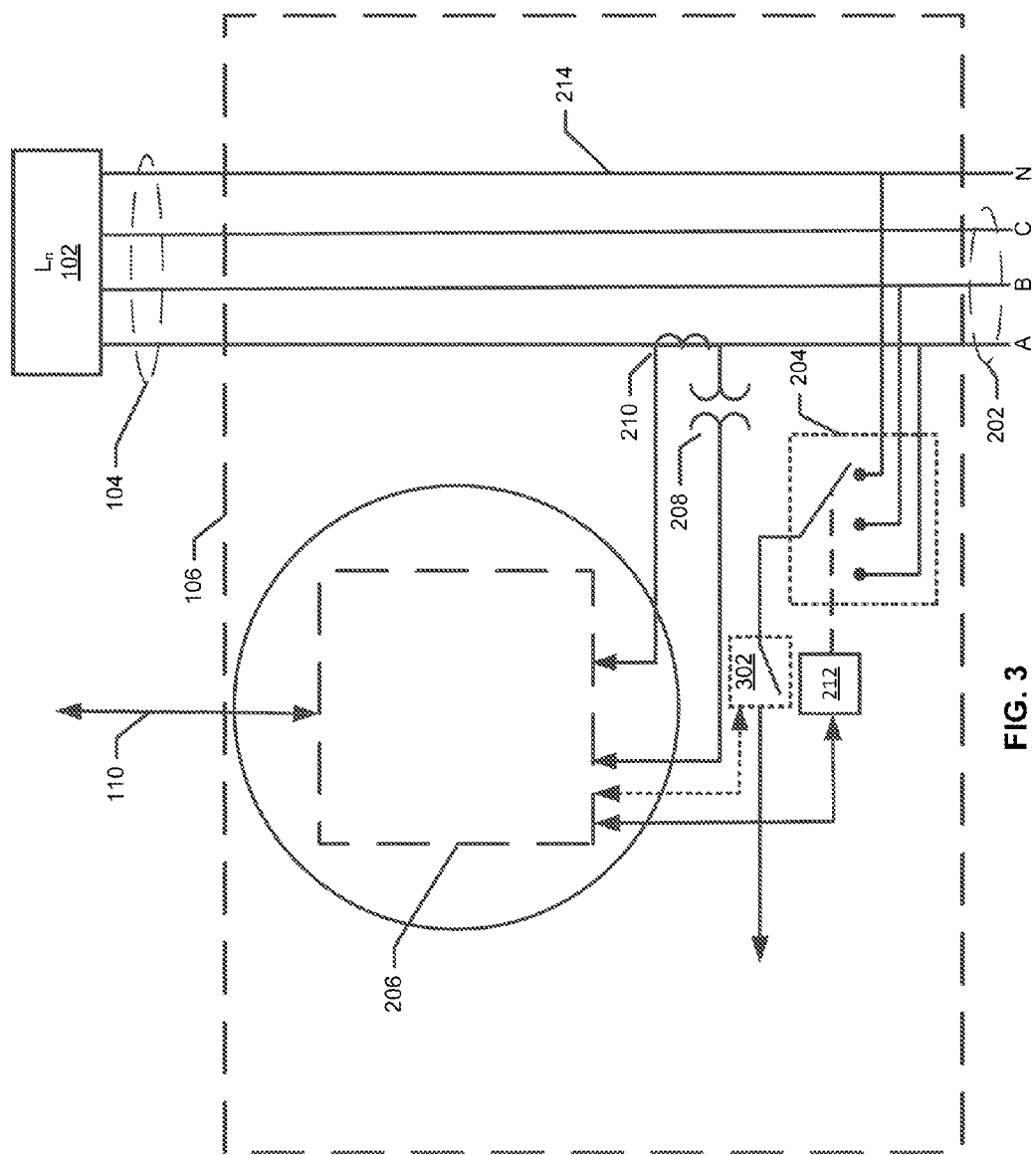
FIG. 3 illustrates an embodiment of a meter used to meter a poly-phase electrical service serving a load.

FIG. 3 illustrates an embodiment of a meter 106 used to meter a poly-phase electrical service 104 serving a load 102. In this embodiment, the poly-phase electrical service 104 is a three-phase service comprised of phase conductors 202 for phase A, phase B and phase C, and a neutral wire 214. In other embodiments, there can be more or fewer electrical phases and phase conductors. In the embodiment shown in FIG. 3, switch 204 is used to provide electrical power to a load control relay (LCR) 302. The LCR can be used to turn on or off select loads using the meter 106. For example, the LCR can be used to turn on or off power to a hot water heater, swimming pool pump or heater, air conditioning equipment, etc. In one aspect, the LCR 302 can have a 40-amp rating. In another aspect, the LCR 302 can have a two-amp rating. In one aspect, the LCR 302 can receive control signals from the meter's electronics 206. In another aspect, the LCR 302 can receive control signals external from the meter 106. For example, the LCR 302 can receive a wireless signal causing the LCR 302 to open or close. As shown in FIG. 3, the switch 204 can be used to connect the LCR to one of phases A, B, or C, or to disconnect it altogether. Though shown as a three-pole, single-throw switch, the switch 204 can be a single switch or a plurality of switches having any number of poles and/or throws. Similar as described in reference to FIG. 2, the control mechanism 212 of FIG. 3 is used to actuate the switch 204 (i.e., causes it to switch from one phase to another or to disconnect the LCR 302). The control mechanism 212 receives a control signal from the meter's electronics 206. Furthermore, in one aspect, the control mechanism 212 can provide a feedback signal to the meter's electronics 206 that indicates the position of the switch 204. In other words, the control mechanism 212 can inform the meter's electronics whether the LCR 302 is being provided single-phase electric service from phase A, phase B, phase C, etc., or whether the LCR 302 is disconnected from electric service.

In one aspect, the meter electronics 206 can comprise a memory (not shown in FIG. 3). The memory can be used to store a phase identifier that indicates the phase of the poly-phase electrical system that the LCR 302 is connected. For example, if the switch 204 is configured such that the phase serving the LCR 302 is phase A, then the phase identifier stored in the memory indicates phase A. Similarly, if the switch 204 switches from phase A to phase B, then the phase identifier stored in the memory indicates phase B. In one aspect, the phase identifier is stored automatically when the LCR 302 is switched from one phase to another (e.g., from phase A to phase B). For example, the control mechanism 212 can provide a signal that indicates the phase that the LCR 302 is connected to. In one non-limiting example, a signal can be sent to the meter 106 over a network 110. In one aspect, the network 110 is an advanced metering infrastructure (AMI) network. The signal can be a command to switch phases to which the LCR 302 is connected from a first phase (e.g., phase A) to a second phase (e.g., phase B), or to disconnect the LCR 302. The command is received by a processor (not shown in FIG. 3) in the meter's electronics 206, which causes the control mechanism 212 to switch the connection from phase A to phase B. The phase identifier in the memory is then updated to reflect that the LCR 302 is now connected to phase B. In another aspect, the phase identifier can be stored in the meter 106 manually by a user that has authorization to write to the memory using, for example, infrared, near-field communications such as BlueTooth, Wi-Fi, RF, RFID, and the like, or by connecting a device such as a computer to the meter 106 using a bus connection. In another aspect, the phase identifier can be communicated to the memory in the meter's electronics 206 via a network 110 that is operably connected with the meter's electronics 206. For example, if an entire circuit is switched, either automatically or manually, by a utility such that phase A becomes phase B or some other similar switching, then a signal can be sent to the meter's electronics 206 over the network 110 to update the phase identifier such that it indicates the LCR 302 is connected to phase B. Once the phase identifier is stored in the memory, it can be transmitted over the network 110 to, for example, the computing device 108 or it can be read from the memory by a user with proper authorization and equipment.

In one aspect, the electronics 206 comprise at least a memory, and one or more processors and provide an interface for receiving a signal from the network 110 and causing the switch 204 to actuate via the control mechanism 212. The memory of the meter electronics 206 can be used to store a phase identifier as described above. The meter electronics 206 can comprise a transmitter that can be used to transmit at least the phase identifier over the network 110 to a separate computing device 108. In one aspect, the network 110 is an advanced metering infrastructure (AMI) network. In one aspect, the meter's electronics 206 can comprise one or more metering micro-controllers including a Teridian 6533 controller or a Teridian 6521 controller as are available from Maxim Integrated Products, Inc. (Sunnyvale, Calif.), among others. In one aspect, the one or more processors can perform metering functions such as determining the number of kilowatt-hours (KWH) of electricity consumed by the load 102. Analog voltage and current inputs are also provided to meter electronics 206. In one aspect, the analog signals are derived from the electrical power feed 104 serving the load 102 and the one being metered by the meter 106. In another aspect, the analog signals are derived from a separate electrical source. In one aspect, the analog voltage signal can be provided by one or more potential transformers (PT) 208, if needed, though other means such as a voltage divider, capacitive coupling, or the like can be used. If the voltage level of the source is sufficiently low (e.g., 0.25 volts AC, or lower), then a PT 208 or other means of stepping down or transforming the voltage can be omitted. Similarly, in one aspect, the analog current signal can be provided by one or more current transformers (CT) 210. In one aspect, the one or more CTs 210 can have a turns ratio of 1:2500. In one aspect, one or more resistors (not shown) can be used to convert the current signal from the CT 210 into a voltage signal.

In one aspect, the one or more processors of the meter electronics 206 can be configured to store a first phase identifier for the first phase of the poly-phase electrical system that the LCR 302 is connected to in the memory. Then, when requested, the processor can retrieve the first phase identifier for the first phase of the poly-phase electrical system that the LCR 302 is connected to from the memory and transmit at least the first phase identifier to the computing device 108 over the network 110 operably connected with the smart meter 106 using the network interface. In one aspect, the switch 204 can be used to switch the LCR 302 such that the LCR 302 is connected to at least a second phase of the poly-phase electrical system. The one or more processors are further configured to store a second phase identifier for the second phase of the poly-phase electrical system that the LCR 302 is connected to in the memory associated with the smart meter 106. The one or more processors are also configured to retrieve the second phase identifier for the second phase of the poly-phase electrical system that the LCR 302 is connected to from the memory and transmit at least the second phase identifier to the computing device 108 over the network 110 operably connected with the smart meter 106 using the network interface. In one aspect, the switch 204 is an automatic switch controlled by the processor and switching the LCR 302 such that the LCR 302 is connected to at least the second phase of the poly-phase electrical system comprises automatically switching the LCR 302 from the first phase to the second phase of the poly-phase electrical system using the switch 204. In one aspect, the one or more processors are operably connected with the switch 204 such that storing the second phase identifier for the second phase of the poly-phase electrical system that the LCR 302 is connected to in the memory associated with the smart meter 106 comprises automatically storing the second phase identifier in the memory when the device is switched from the first phase to the second phase of the poly-phase electrical system.

Figure 4:
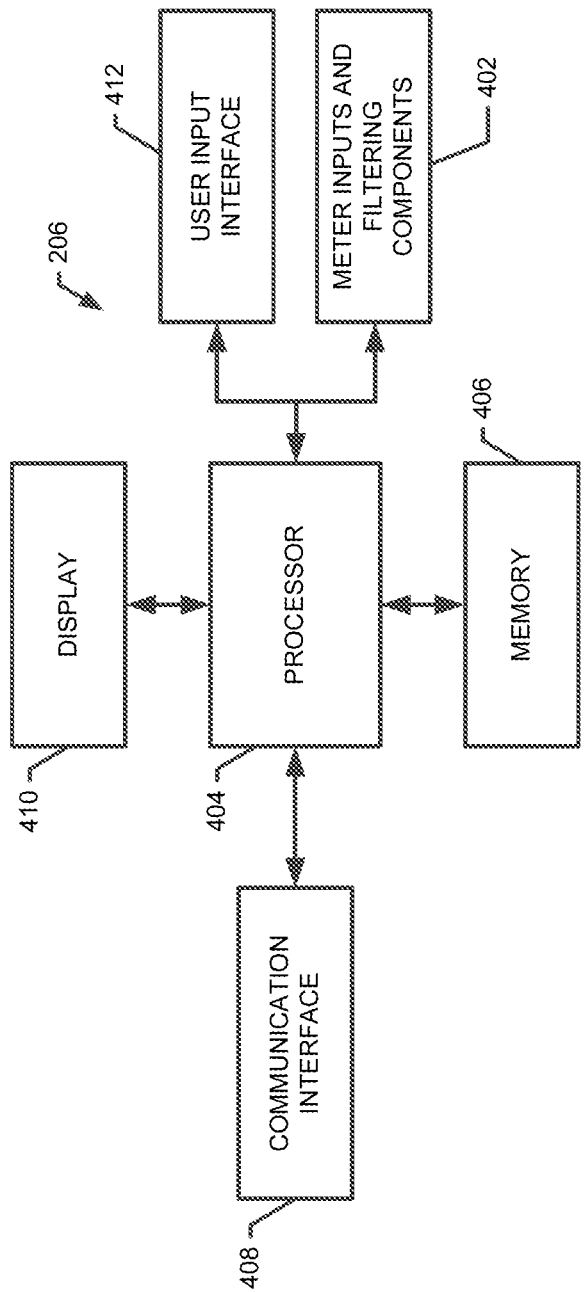
FIG. 4 illustrates a block diagram of an entity capable of operating as meter electronics in accordance with one embodiment of the present invention.

Referring now to FIG. 4, a block diagram of an entity capable of operating as meter electronics 206 is shown in accordance with one embodiment of the present invention. The entity capable of operating as a meter electronics 206 includes various means for performing one or more functions in accordance with embodiments of the present invention, including those more particularly shown and described herein. It should be understood, however, that one or more of the entities may include alternative means for performing one or more like functions, without departing from the spirit and scope of the present invention. As shown, the entity capable of operating as a meter electronics 206 can generally include means, such as one or more processors 404 for performing or controlling the various functions of the entity. As shown in FIG. 4, in one embodiment, meter electronics 206 can comprise metering components such as meter inputs and filtering components 402. In one aspect, the meter inputs and filter components 402 can comprise voltage and current inputs, one or more ADCs, filtering components, and the like. Further comprising this embodiment of meter electronics 206 are one or more processors 404 and memory 406.

In one embodiment, the one or more processors 404 are in communication with or include memory 406, such as volatile and/or non-volatile memory that stores content, data or the like. For example, the memory 406 may store content transmitted from, and/or received by, the entity. Also for example, the memory 406 may store software applications, instructions or the like for the one or more processors 404 to perform steps associated with operation of the entity in accordance with embodiments of the present invention. In particular, the one or more processors 404 may be configured to perform the processes discussed in more detail herein for receiving an actuation command for a switch, causing a control associated with the switch to implement the actuation, receiving a phase identifier from the switch, and transmitting the phase identifier to a computing device over a network. For example, according to one embodiment the one or more processors 404 can be configured to update the phase identifier when a device (e.g., a load or a LCR) is switched from a first phase to a second phase, as described herein.

In addition to the memory 406, the one or more processors 404 can also be connected to at least one interface or other means for displaying, transmitting and/or receiving data, content or the like. In this regard, the interface(s) can include at least one communication interface 408 or other means for transmitting and/or receiving data, content or the like, as well as at least one user interface that can include a display 410 and/or a user input interface 412. In one aspect, the communication interface 408 can be used to transfer a phase identifier stored in the memory 406 to a remote computing device such as the one described below over a network 110. In one aspect, the network 110 is an advanced metering infrastructure (AMI) network. In one aspect, the communication interface 608 can comprise a wireless communication interface such as a Wi-Fi transceiver. The user input interface 412, in turn, can comprise any of a number of devices allowing the entity to receive data from a user, such as a keypad, a touch display, a joystick or other input device.

Figure 5:
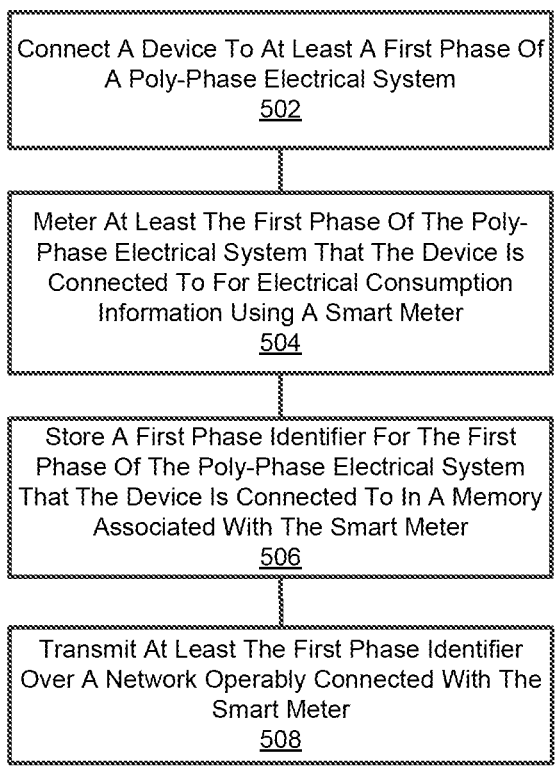
FIG. 5 is a flowchart illustrating the operations that may be taken for phase identification in a smart meter.

Referring now to FIG. 5, the operations are illustrated that may be taken for phase identification in a smart meter. At step 502, a device is connected to at least a first phase of a poly-phase electrical system. In one aspect, the device is an electrical load. In one aspect, the electrical load is a single-phase electrical load. In one aspect, the electrical load is a poly-phase electrical load. In one aspect, the poly-phase electrical load is a three-phase electrical load. In one aspect, the device is a load control relay (LCR). At step 504, at least the first phase of the poly-phase electrical system that the device is connected to is metered for electrical consumption information using a smart meter. At step 506. a first phase identifier for the first phase of the poly-phase electrical system that the device is connected to is stored in a memory associated with the smart meter. At step 508, at least the first phase identifier is transmitted over a network operably connected with the smart meter. In one aspect, the network 110 is an advanced metering infrastructure (AMI) network.

Figure 6:
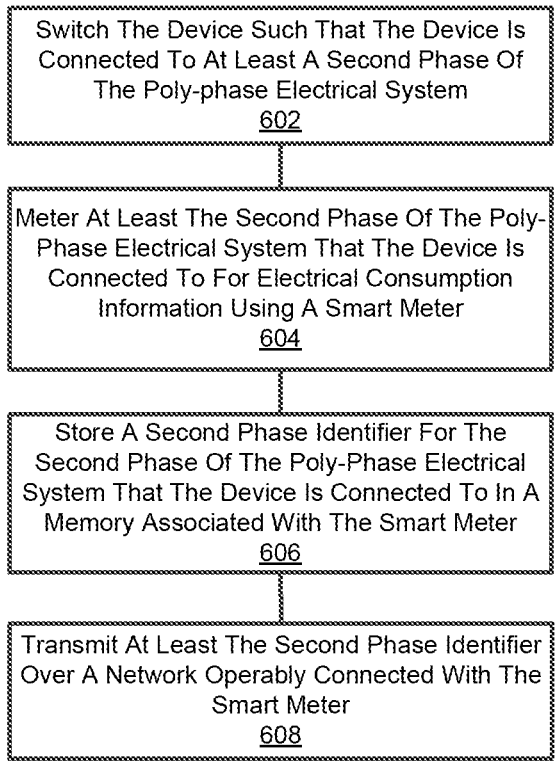
FIG. 6 is another flowchart illustrating the operations that may be taken for phase identification in a smart meter.

In one aspect, the operations for phase identification in a smart meter as shown in FIG. 5 can further include the steps illustrated in FIG. 6. At step 602, the device can be switched such that the device is connected to at least a second phase of the poly-phase electrical system. In one aspect, switching the device such that the device is connected to at least the second phase of the poly-phase electrical system comprises automatically switching the device from the first phase to the second phase of the poly-phase electrical system using the smart meter. At step 604, at least the second phase of the poly-phase electrical system that the device is connected to is metered for electrical consumption information using the smart meter. At step 606, a second phase identifier for the second phase of the poly-phase electrical system that the device is connected to is stored in the memory associated with the smart meter. In one aspect, storing the second phase identifier for the second phase of the poly-phase electrical system that the device is connected to in the memory associated with the smart meter comprises automatically storing the second phase identifier when the device is switched from the first phase to the second phase of the poly-phase electrical system. At step 608, the second phase identifier is transmitted over the network operably connected with the smart meter.

Figure 7:
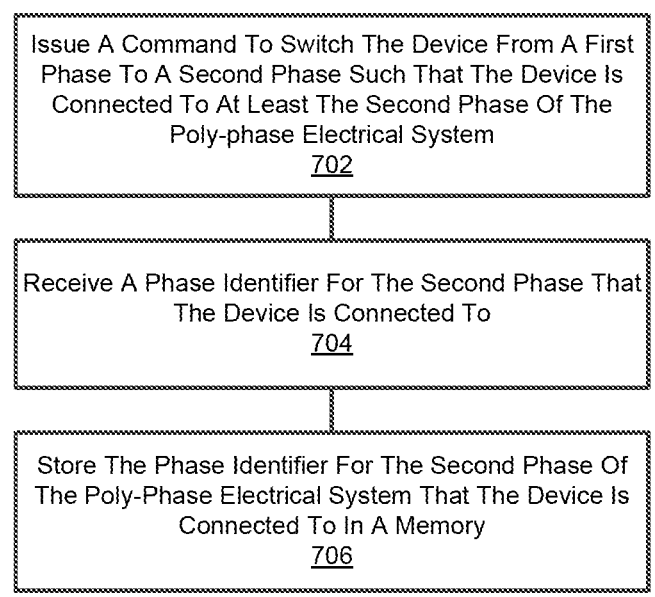
FIG. 7 is a flowchart illustrating the operations that can be taken to switch a device from a first phase connection to a second phase connection and to update the phase identifier for the device connection using a computing device such as the one described in reference to FIG. 8, below.

FIG. 7 illustrates the operations that can be taken to switch a device from a first phase connection to a second phase connection and to update the phase identifier for the device connection using a computing device such as the one described in reference to FIG. 8, below. At step 702, a command is issued by a computing device and transmitted to a smart meter. The command is to switch the phase that a device is connected to from a first phase to a second phase using the smart meter. In one aspect, the device is an electrical load (either single-phase or poly-phase). In another aspect, the device is a load control relay (LCR), either single- or poly-phase. At step 704, in response to the switch command, a phase identifier for the second phase that the device is connected to is received by the computing device from the smart meter. For example, the phase identifier can be an identifier that identifies the phase that the device is connected to as phase A, phase B, Phase C, or the like. At step 706, the phase identifier is stored in the memory of the computing device.

The above system has been described above as comprised of units. One skilled in the art will appreciate that this is a functional description and that software, hardware, or a combination of software and hardware can perform the respective functions. A unit, such as a smart appliance, a smart meter, a smart grid, a utility computing device, a vendor or manufacturer's computing device, etc., can be software, hardware, or a combination of software and hardware. The units can comprise the switching software 806 as illustrated in FIG. 8 and described below. In one exemplary aspect, the units can comprise a computing device 108 as referenced above and further described below.

FIG. 8 is a block diagram illustrating an exemplary operating environment for performing the disclosed methods. This exemplary operating environment is only an example of an operating environment and is not intended to suggest any limitation as to the scope of use or functionality of operating environment architecture. Neither should the operating environment be interpreted as having any dependency or requirement relating to any one or combination of components illustrated in the exemplary operating environment.

The present methods and systems can be operational with numerous other general purpose or special purpose computing system environments or configurations. Examples of well known computing systems, environments, and/or configurations that can be suitable for use with the systems and methods comprise, but are not limited to, personal computers, server computers, laptop devices, and multiprocessor systems. Additional examples comprise set top boxes, programmable consumer electronics, network PCs, minicomputers, mainframe computers, smart meters, smart-grid components, distributed computing environments that comprise any of the above systems or devices, and the like.

The processing of the disclosed methods and systems can be performed by software components. The disclosed systems and methods can be described in the general context of computer-executable instructions, such as program modules, being executed by one or more computers or other devices. Generally, program modules comprise computer code, routines, programs, objects, components, data structures, etc. that perform particular tasks or implement particular abstract data types. The disclosed methods can also be practiced in grid-based and distributed computing environments where tasks are performed by remote processing devices that are linked through a communications network. In a distributed computing environment, program modules can be located in both local and remote computer storage media including memory storage devices.

Further, one skilled in the art will appreciate that the systems and methods disclosed herein can be implemented via a general-purpose computing device in the form of a computing device 108. The components of the computing device 108 can comprise, but are not limited to, one or more processors or processing units 803, a system memory 812, and a system bus 813 that couples various system components including the processor 803 to the system memory 812. In the case of multiple processing units 803, the system can utilize parallel computing. In one aspect, the processor 803 is configured to send an actuation signal to a smart meter and receive a phase identifier from the smart meter in accordance with the electrical phase that the device at the smart meter is connected.

The system bus 813 represents one or more of several possible types of bus structures, including a memory bus or memory controller, a peripheral bus, an accelerated graphics port, and a processor or local bus using any of a variety of bus architectures. By way of example, such architectures can comprise an Industry Standard Architecture (ISA) bus, a Micro Channel Architecture (MCA) bus, an Enhanced ISA (EISA) bus, a Video Electronics Standards Association (VESA) local bus, an Accelerated Graphics Port (AGP) bus, and a Peripheral Component Interconnects (PCI), a PCI-Express bus, a Personal Computer Memory Card Industry Association (PCMCIA), Universal Serial Bus (USB) and the like. The bus 813, and all buses specified in this description can also be implemented over a wired or wireless network connection and each of the subsystems, including the processor 803, a mass storage device 804, an operating system 805, switching software 806, phase identifier data 807, a network adapter 808, system memory 812, an Input/Output Interface 810, a display adapter 809, a display device 811, and a human machine interface 802, can be contained within one or more remote computing devices or clients 814*a,b,c* at physically separate locations, connected through buses of this form, in effect implementing a fully distributed system or distributed architecture.

The computing device 108 typically comprises a variety of computer readable media. Exemplary readable media can be any available media that is non-transitory and accessible by the computing device 108 and comprises, for example and not meant to be limiting, both volatile and non-volatile media, removable and non-removable media. The system memory 812 comprises computer readable media in the form of volatile memory, such as random access memory (RAM), and/or non-volatile memory, such as read only memory (ROM). The system memory 812 typically contains data such as phase identifier data 807 and/or program modules such as operating system 805 and switching software 806 that are immediately accessible to and/or are presently operated on by the processing unit 803.

In another aspect, the computing device 108 can also comprise other non-transitory, removable/non-removable, volatile/non-volatile computer storage media. By way of example, FIG. 8 illustrates a mass storage device 804 that can provide non-volatile storage of computer code, computer readable instructions, data structures, program modules, and other data for the computing device 108. For example and not meant to be limiting, a mass storage device 804 can be a hard disk, a removable magnetic disk, a removable optical disk, magnetic cassettes or other magnetic storage devices, flash memory cards, CD-ROM, digital versatile disks (DVD) or other optical storage, random access memories (RAM), read only memories (ROM), electrically erasable programmable read-only memory (EEPROM), and the like.

Optionally, any number of program modules can be stored on the mass storage device 604, including by way of example, an operating system 805 and switching software 806. Each of the operating system 805 and switching software 806 (or some combination thereof) can comprise elements of the programming and the switching software 806. Phase identifier data 807 can also be stored on the mass storage device 804. Phase identifier data 807 can be stored in any of one or more databases known in the art. Examples of such databases comprise, DB2® (IBM Corporation, Armonk, N.Y.), Microsoft® Access, Microsoft® SQL Server, (Microsoft Corporation, Bellevue, Wash.), Oracle®, (Oracle Corporation, Redwood Shores, Calif.), mySQL, PostgreSQL, and the like. The databases can be centralized or distributed across multiple systems.

In another aspect, the user can enter commands and information into the computing device 108 via an input device (not shown). Examples of such input devices comprise, but are not limited to, a keyboard, pointing device (e.g., a "mouse"), a microphone, a joystick, a scanner, tactile input devices such as gloves, and other body coverings, and the like These and other input devices can be connected to the processing unit 803 via a human machine interface 802 that is coupled to the system bus 813, but can be connected by other interface and bus structures, such as a parallel port, game port, an IEEE 1394 Port (also known as a Firewire port), a serial port, or a universal serial bus (USB).

In yet another aspect, a display device 811 can also be connected to the system bus 813 via an interface, such as a display adapter 809. It is contemplated that the computing device 108 can have more than one display adapter 809 and the computing device 108 can have more than one display device 811. For example, a display device can be a monitor, an LCD (Liquid Crystal Display), or a projector. In addition to the display device 811, other output peripheral devices can comprise components such as speakers (not shown) and a printer (not shown), which can be connected to the computer 801 via Input/Output Interface 810. Any step and/or result of the methods can be output in any form to an output device. Such output can be any form of visual representation, including, but not limited to, textual, graphical, animation, audio, tactile, and the like.

The computing device 108 can operate in a networked environment using logical connections to one or more remote computing devices or clients 814*a,b,c*. By way of example, a remote computing device 814 can be a personal computer, portable computer, a server, a router, a network computer, a smart meter, a vendor or manufacture's computing device, smart grid components, a peer device or other common network node, and so on. Logical connections between the computing device 108 and a remote computing device or client 814*a,b,c* can be made via a local area network (LAN) and a general wide area network (WAN). Such network connections can be through a network adapter 608. A network adapter 808 can be implemented in both wired and wireless environments. Such networking environments are conventional and commonplace in offices, enterprise-wide computer networks, intranets, and other networks 815 such as the Internet or an AMI network.

For purposes of illustration, application programs and other executable program components such as the operating system 805 are illustrated herein as discrete blocks, although it is recognized that such programs and components reside at various times in different storage components of the computing device 801, and are executed by the data processor(s) of the computer. An implementation of switching software 806 can be stored on or transmitted across some form of computer readable media. Any of the disclosed methods can be performed by computer readable instructions embodied on computer readable media. Computer readable media can be any available media that can be accessed by a computer. By way of example and not meant to be limiting, computer readable media can comprise "computer storage media" and "communications media." "Computer storage media" comprise volatile and non-volatile, removable and non-removable media implemented in any methods or technology for storage of information such as computer readable instructions, data structures, program modules, or other data. Exemplary computer storage media comprises, but is not limited to, RAM, ROM, EEPROM, flash memory or other memory technology, CD-ROM, digital versatile disks (DVD) or other optical storage, magnetic cassettes, magnetic tape, magnetic disk storage or other magnetic storage devices, or any other medium which can be used to store the desired information and which can be accessed by a computer.

The methods and systems can employ Artificial Intelligence techniques such as machine learning and iterative learning. Examples of such techniques include, but are not limited to, expert systems, case based reasoning, Bayesian networks, behavior based AI, neural networks, fuzzy systems, evolutionary computation (e.g. genetic algorithms), swarm intelligence (e.g. ant algorithms), and hybrid intelligent systems (e.g. Expert inference rules generated through a neural network or production rules from statistical learning).

As described above and as will be appreciated by one skilled in the art, embodiments of the present invention may be configured as a system, method, or computer program product. Accordingly, embodiments of the present invention may be comprised of various means including entirely of hardware, entirely of software, or any combination of software and hardware. Furthermore, embodiments of the present invention may take the form of a computer program product on a computer-readable storage medium having computer-readable program instructions (e.g., computer software) embodied in the storage medium. Any suitable non-transitory computer-readable storage medium may be utilized including hard disks, CD-ROMs, optical storage devices, or magnetic storage devices.

Embodiments of the present invention have been described above with reference to block diagrams and flowchart illustrations of methods, apparatuses (i.e., systems) and computer program products. It will be understood that each block of the block diagrams and flowchart illustrations, and combinations of blocks in the block diagrams and flowchart illustrations, respectively, can be implemented by various means including computer program instructions. These computer program instructions may be loaded onto a general purpose computer, special purpose computer, or other programmable data processing apparatus, such as the one or more processors 803 discussed above with reference to FIG. 8 or the one or more processors 404 of FIG. 4, to produce a machine, such that the instructions which execute on the computer or other programmable data processing apparatus create a means for implementing the functions specified in the flowchart block or blocks.

These computer program instructions may also be stored in a computer-readable memory that can direct a computer or other programmable data processing apparatus (e.g., one or more processors 803 of FIG. 8 or the one or more processors 404 of FIG. 4), to function in a particular manner, such that the instructions stored in the computer-readable memory produce an article of manufacture including computer-readable instructions for implementing the function specified in the flowchart block or blocks. The computer program instructions may also be loaded onto a computer or other programmable data processing apparatus to cause a series of operational steps to be performed on the computer or other programmable apparatus to produce a computer-implemented process such that the instructions that execute on the computer or other programmable apparatus provide steps for implementing the functions specified in the flowchart block or blocks.

Accordingly, blocks of the block diagrams and flowchart illustrations support combinations of means for performing the specified functions, combinations of steps for performing the specified functions and program instruction means for performing the specified functions. It will also be understood that each block of the block diagrams and flowchart illustrations, and combinations of blocks in the block diagrams and flowchart illustrations, can be implemented by special purpose hardware-based computer systems that perform the specified functions or steps, or combinations of special purpose hardware and computer instructions.

Unless otherwise expressly stated, it is in no way intended that any method set forth herein be construed as requiring that its steps be performed in a specific order. Accordingly, where a method claim does not actually recite an order to be followed by its steps or it is not otherwise specifically stated in the claims or descriptions that the steps are to be limited to a specific order, it is no way intended that an order be inferred, in any respect. This holds for any possible non-express basis for interpretation, including: matters of logic with respect to arrangement of steps or operational flow; plain meaning derived from grammatical organization or punctuation; the number or type of embodiments described in the specification.

Throughout this application, various publications may be referenced. The disclosures of these publications in their entireties are hereby incorporated by reference into this application in order to more fully describe the state of the art to which the methods and systems pertain.

Many modifications and other embodiments of the inventions set forth herein will come to mind to one skilled in the art to which these embodiments of the invention pertain having the benefit of the teachings presented in the foregoing descriptions and the associated drawings. Therefore, it is to be understood that the embodiments of the invention are not to be limited to the specific embodiments disclosed and that modifications and other embodiments are intended to be included within the scope of the appended claims. Moreover, although the foregoing descriptions and the associated drawings describe exemplary embodiments in the context of certain exemplary combinations of elements and/or functions, it should be appreciated that different combinations of elements and/or functions may be provided by alternative embodiments without departing from the scope of the appended claims. In this regard, for example, different combinations of elements and/or functions than those explicitly described above are also contemplated as may be set forth in some of the appended claims. Although specific terms are employed herein, they are used in a generic and descriptive sense only and not for purposes of limitation.

What is claimed is:

1. A method of phase identification for a meter comprising: connecting a device to at least a first phase of a poly-phase electrical system;
   metering at least the first phase of the poly-phase electrical system that the device is connected to for electrical consumption information using a meter;
   storing a first phase identifier for the first phase of the poly-phase electrical system that the device is connected to in a memory associated with the meter; and
   transmitting at least the first phase identifier over a network operably connected with the meter; wherein connecting the device to at least the first phase of the poly-phase electrical system comprises connecting an electrical load to the first phase of the poly-phase electrical system using one or more switches.

2. The method of claim 1, wherein the electrical load is a single-phase electrical load.

3. The method of claim 1, wherein connecting the device to the first phase of the poly-phase electrical system comprises connecting a load control relay to the first phase of the poly-phase electrical system using one or more switches.

4. The method of claim 3, wherein the poly-phase electrical system provides electrical service to a poly-phase electrical load.

5. The method of claim 1, further comprising:
   switching the device such that the device is connected to at least a second phase of the poly-phase electrical system using one or more switches;
   metering at least the second phase of the poly-phase electrical system that the device is connected to for electrical consumption information using the meter;
   storing a second phase identifier for the second phase of the poly-phase electrical system that the device is connected to in the memory associated with the meter; and
   transmitting at least the second phase identifier over the network operably connected with the meter.

6. The method of claim 5, wherein switching the device such that the device is connected to at least the second phase of the poly-phase electrical system comprises automatically switching the device from the first phase to the second phase of the poly-phase electrical system using the meter.

7. The method of claim 5, wherein storing the second phase identifier for the second phase of the poly-phase electrical system that the device is connected to in the memory associated with the meter comprises automatically storing the second phase identifier when the device is switched from the first phase to the second phase of the poly-phase electrical system.

8. A meter comprised of
   one or more switches, wherein the one or more switches are used to connect a device to at least a first phase of a poly-phase electrical system;
   metering components, wherein the metering components are used to meter at least the first phase of the poly-phase electrical system that the device is connected to for electrical consumption information;
   a memory;
   at least one network interface; and
   a processor, wherein the processor is operably connected with the one or more switches, the metering components, the memory and the at least one network interface, wherein the processor is configured to:
      store a first phase identifier for the first phase of the poly-phase electrical system that the device is connected to in the memory; and
      retrieve the first phase identifier for the first phase of the poly-phase electrical system that the device is connected to from the memory and transmit at least the first phase identifier over a network operably connected with the meter using the network interface.

9. The meter of claim 8, wherein the device comprises an electrical load and the one or more switches are used to connect the electrical load to at least the first phase of the poly-phase electrical system.

10. The meter of claim 9, wherein the electrical load is a single-phase electrical load.

11. The meter of claim 8, wherein the device is a load control relay and the one or more switches are used to connect the load control relay to the first phase of the poly-phase electrical system.

12. The meter of claim 8, wherein the poly-phase electrical system provides electrical service to a poly-phase electrical load.

13. The meter of claim 8, wherein the one or more switches are used to switch the device such that the device is connected to at least a second phase of the poly-phase electrical system such that the metering components meter at least the second phase of the poly-phase electrical system that the device is connected to for electrical consumption information using the meter; and the processor is further configured to:
   store a second phase identifier for the second phase of the poly-phase electrical system that the device is connected to in the memory associated with the meter; and
   retrieve the second phase identifier for the second phase of the poly-phase electrical system that the device is connected to from the memory and transmit at least the second phase identifier over the network operably connected with the meter using the network interface.

14. The meter of claim 13, wherein the one or more switch are automatic switches controlled by the processor and switching the device such that the device is connected to at least the second phase of the poly-phase electrical system comprises automatically switching the device from the first phase to the second phase of the poly-phase electrical system using the one or more switches.

15. The meter of claim 13, wherein the one or more switches are operably connected with the processor such that storing the second phase identifier for the second phase of the poly-phase electrical system that the device is connected to in the memory associated with the meter comprises automatically storing the second phase identifier in the memory when the device is switched from the first phase to the second phase of the poly-phase electrical system.

16. A system comprised of:
a computing device;
a network, wherein the computing device is operably connected with the network; and
a meter, said meter comprised of:
one or more switches, wherein the one or more switches are used to connect a device to at least a first phase of a poly-phase electrical system;
metering components, wherein the metering components are used to meter at least the first phase of the poly-phase electrical system that the device is connected to for electrical consumption information;
a memory;
at least one network interface that operable connects the meter with the network; and
a processor, wherein the processor is operably connected with the one or more switches, the metering components, the memory and the at least one network interface, wherein the processor is configured to:
store a first phase identifier for the first phase of the poly-phase electrical system that the device is connected to in the memory; and
retrieve the first phase identifier for the first phase of the poly-phase electrical system that the device is connected to from the memory and transmit at least the first phase identifier to the computing device over the network operably connected with the meter using the network interface.

17. The system of claim 16, wherein the device comprises an electrical load and the one or more switches are used to connect the electrical load to at least the first phase of the poly-phase electrical system.

18. The system of claim 17, wherein the electrical load is a single-phase electrical load.

19. The system of claim 16, wherein the device is a load control relay and the one or more switches are used to connect the load control relay to the first phase of the poly-phase electrical system.

20. The system of claim 19, wherein the poly-phase electrical system provides electrical service to a poly-phase electrical load.

21. The system of claim 16, wherein the one or more switches are used to switch the device such that the device is connected to at least a second phase of the poly-phase electrical system such that the metering components meter at least the second phase of the poly-phase electrical system that the device is connected to for electrical consumption information using the meter; and the processor is further configured to:
store a second phase identifier for the second phase of the poly-phase electrical system that the device is connected to in the memory associated with the meter; and
retrieve the second phase identifier for the second phase of the poly-phase electrical system that the device is connected to from the memory and transmit at least the second phase identifier to the computing device over the network operably connected with the meter using the network interface.

22. The system of claim 21, wherein the one or more switch are automatic switches controlled by the processor and switching the device such that the device is connected to at least the second phase of the poly-phase electrical system comprises automatically switching the device from the first phase to the second phase of the poly-phase electrical system using the one or more switches.

23. The system of claim 21, wherein the one or more switches are operably connected with the processor such that storing the second phase identifier for the second phase of the poly-phase electrical system that the device is connected to in the memory associated with the meter comprises automatically storing the second phase identifier in the memory when the device is switched from the first phase to the second phase of the poly-phase electrical system.

* * * * *